(12) United States Patent
Yamada

(10) Patent No.: US 7,663,684 B2
(45) Date of Patent: Feb. 16, 2010

(54) CHARGE TRANSFER DEVICE AND A SOLID STATE IMAGING DEVICE USING THE CHARGE TRANSFER DEVICE

(75) Inventor: Tetsuo Yamada, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 692 days.

(21) Appl. No.: 10/806,120

(22) Filed: Mar. 23, 2004

(65) Prior Publication Data

US 2004/0189344 A1    Sep. 30, 2004

(30) Foreign Application Priority Data

Mar. 28, 2003   (JP)   ............... 2003-091783
Mar. 28, 2003   (JP)   ............... 2003-091784

(51) Int. Cl.
*H04N 3/14*   (2006.01)
(52) U.S. Cl. ...................... 348/314; 257/230
(58) Field of Classification Search ............... 348/321, 348/323, 314, 311, 294, 299, 320, 322; 257/229, 257/230
See application file for complete search history.

(56) References Cited

U.S. PATENT DOCUMENTS

| | | | |
|---|---|---|---|
| 4,884,142 A * | 11/1989 | Suzuki | ............... 348/296 |
| 5,196,939 A * | 3/1993 | Elabd et al. | ............... 348/314 |
| 5,438,211 A | 8/1995 | Nakamura et al. | |
| 7,053,948 B2 * | 5/2006 | Konishi | ............... 348/311 |
| 7,176,972 B2 * | 2/2007 | Mutoh et al. | ............... 348/315 |

FOREIGN PATENT DOCUMENTS

| | | |
|---|---|---|
| JP | 6-338524 | 12/1994 |
| JP | 2001-053267 | 2/2001 |

* cited by examiner

*Primary Examiner*—Justin P Misleh
(74) *Attorney, Agent, or Firm*—Arent Fox LLP

(57) ABSTRACT

An electric charge transfer apparatus comprising a plurality of vertical charge transfer devices for transferring a signal electric charge, a plurality of charge-discharging circuit sets formed next to each of the plurality of vertical charge transfer device, and an output circuit for outputting the signal electric charge transferred by the plurality of charge-discharging circuits to outside of the electric charge transfer apparatus. Each of the plurality of charge-discharging circuit sets includes at least two charge-discharging circuits for discharging the signal electric charge transferred by at least one of adjacent vertical transfer devices consecutively to avoid an electrical barrier caused by left-behind electric charge.

5 Claims, 7 Drawing Sheets

CHARGE TRANSFER DEVICE AND A SOLID STATE IMAGING DEVICE USING THE CHARGE TRANSFER DEVICE

This application is based on Japanese Patent Application 2003-091783, filed on Mar. 28, 2003, and Japanese Patent Application 2003-091784, filed on Mar. 28, 2003, the entire contents of which are incorporated herein by reference.

BACKGROUND OF THE INVENTION

A) Field of the Invention

This invention relates to a charge transfer device and a solid-state imaging device using the charge transfer device, and more specifically to an overflow drain structure of the charge transfer device.

B) Description of the Related Art

Conventionally, in a solid-state imaging device using a charge transfer device, for example, a signal charge of an arbitral vertical line of a photoelectric conversion element is thinning out alternatively by providing an overflow drain for draining a signal charge to a vertical charge transfer device. (For example, refer to Japanese Laid-Open Patent Hei6-338524.)

FIGS. 7 are drawings showing a charge-discharging structure in the conventional charge transfer device of the solid-state imaging device. FIG. 7A is a plan view showing a charge-discharging structure in the conventional charge transfer device of the solid-state imaging device.

A solid-state imaging device 300 is consisted of a multiplicity of photoelectric conversion elements 381 arranged in a tetragonal matrix, plurality of columns of vertical charge transfer devices (VCCD) 382, a horizontal charge transfer device (HCCD) 383 and an output circuit 384.

A signal charge 387 stored in the photoelectric conversion elements 381 is vertically transferred from the upper side to the lower side in the drawing by the adjacent vertical charge transfer device 382. The horizontal charge transfer device 383 receives the signal charges 387 transferred by plurality of columns of the vertical charge transfer devices 382 in parallel and transfers them to the output circuit 384 one after another. The output circuit 384 outputs the signal charges 387 transferred by the horizontal charge transfer device 383 to outside of the solid-state imaging device 300.

A charge-discharging device 390 is formed around the horizontal charge transfer device 383 near the lower end of the vertical charge transfer device 382. The charge-discharging device 390 is consisted of a transfer circuit 391, discharging control gate 393 and a overflow drain 395 and can discharge the signal charge 387 transferred by the vertical charge transfer device 382 to outside of the solid-state imaging device 300.

FIG. 7B is a schematic cross sectional view showing a structure of the charge-discharging device 390.

The transfer circuit 391 is consisted of n-type transfer channel (hereinafter called transfer channel) 391c formed on the surface of p-well (or p-type substrate) 385, and transfer electrode 391e formed above transfer channel 391c with the insulating film 386 therebetween, and forms one transfer unit of the vertical charge transfer device 382. A transfer voltage supplying line 392 supplies a control voltage φvn to the transfer electrode 391e.

The discharging control gate 393 is consisted of a transfer channel 393c which is an area between the n-type circuit formed as overflow drain 395 and the transfer channel 391c of the transfer circuit 391, and a discharging control gate electrode 393e formed above discharging channel 393c with the insulated film 386 therebetween. Turning on/off of the discharging control gate 393 is controlled by control voltage φrc supplied by the discharging control voltage supply line 394. Moreover, when the control voltage φrc is in a state of high level, the discharging control gate is ON, and when the control voltage φrc is in a state of low level, the discharging control gate is OFF.

The overflow drain 395 is consisted of an n-type area formed on a surface of the p-well (or p-type substrate) 385 and is a drain for discharging the signal charge 387 to the outside. The drain voltage supplying line 396 supplies a drain voltage Vdr to the drain 395.

FIG. 7C is an electrical potential distribution map formed in a semiconductor of the charge-discharging device 390 shown in FIG. 7B.

Electrical potential 397 shows channel electrical potential of the transfer channel, electrical potential 398off shows channel electrical potential when the drain operation is turned off (control voltage φrc is in the state of low level), electrical potential 398on shows channel electrical potential when the drain operation is turned on (control voltage φrc is in the state of high level), and electrical potential 399 shows drain electrical potential of the voltage overflow drain 395.

During the solid-state imaging elements 300 is being operated normally, the charge-discharging control electrode 393e maintains the state of turned-off (control voltage φrc is being at the low level), and the signal charge 387 transferred in the vertical charge transfer device 382 is not discharged to the outside, but is transferred to the horizontal charge transfer device 383. Then, depending on necessity, when the signal charge 387 is transferred to the transfer channel 391c, as shown with an dotted arrow in the drawing, by turning on the charge-discharging control electrode 393e (making the control voltage φrc at the high level), the signal charge 387 can be drained from the transfer channel 391c to the charge overflow drain 395 via the discharging channel 393c.

According to the above-described operation, since it is operated at once in plurality of the electric charge-discharging device 390 arranged in parallel, the signal charge of the one horizontal line of the photoelectric conversion element 381 that was chosen can be alternatively thinned out by changing on-off of electric charge drain control electrode 393e at specific timing.

Generally, there may be a potential barrier as shown in FIG. 7C at a certain probability in the transfer channel 391c, for example, by manufacturing unevenness. When there is a potential barrier 389, the electric charge below a fixed amount cannot be drained by the charge-discharging device 395. In the above-described electric charge-discharging device 390, the signal electric charge 387 may be remained by the electric potential barrier 389 in the transfer channel 391c having the electric potential barrier 389 when the signal electric charge 387 is drained to the charge-discharging device 395 with the electric charge-discharging control electrode 393e turned on. The remained signal electric charge is output from the vertical charge transfer circuit 382 through the horizontal charge transfer device 383 after the drain operation finishes.

For example, all the signal electric charges are drained to the charge-discharging device 395 by the electric charge-discharging device 390, the remained electric charge is output from the vertical line having the electric potential barrier 389, and it appears as a white line on a reproduced screen. This phenomenon will appear as a picture superimposed by the white line on a digital still camera etc. also in a case of the well-known process for thinning out one-half of the vertical scanning lines, and will worsen quality of image remarkably.

SUMMARY OF THE INVENTION

It is an object of the present invention to control appearance of a longitudinal line by left-behind electric charge caused by an electric potential barrier or an electric potential unevenness which may exist in a transfer channel of a vertical electric charge transfer device included by an electric charge-discharging device.

It is another object of the present invention to remarkably decrease generation of left-behind electric charge caused by the electric charge-discharging direction of an electric charge-discharging device.

According to one aspect of the present invention, there is provided a n electric charge transfer apparatus, comprising: a plurality of vertical charge transfer devices, each of which transfers a signal electric charge; a plurality of charge-discharging circuits formed next to each vertical transfer device, each charge-discharging circuit discharging the signal electric charge transferred by at least either one of the adjoining vertical transfer devices; and an output circuit that outputs the signal electric charge transferred by the vertical charge transfer devices to an outside of the electric charge transfer apparatus.

According to another aspect of the present invention, there is provided a solid-state imaging device, comprising: a semiconductor substrate; a plurality of photoelectric conversion elements formed on said semiconductor substrate; a plurality of vertical charge transfer device formed above said semiconductor substrate, which transfer signal electric charge photoelectric converted by said photoelectric conversion elements; a plurality of charge-discharging circuits formed next to each vertical transfer device, each charge-discharging circuit discharging the signal electric charge converted by the photoelectric conversion element at a predetermined position and transferred by at least either one of the adjoining vertical transfer devices; and an output circuit that outputs the signal electric charge transferred by the vertical charge transfer devices to outside.

According to the present invention, appearance of a longitudinal line by the left-behind electric charge caused by an electric potential barrier or an electric potential unevenness which may exist in a transfer channel of a vertical electric charge transfer device included in an electric charge-discharging device can be controlled.

According to still another aspect of the present invention, there is provided an electric charge transfer apparatus, comprising: a plurality of vertical charge transfer devices, each of which has plural lines of charge transfer electrodes and transfers signal electric charge; a plurality of charge-discharging circuits arranged to each line of the charge transfer electrodes, each of the charge-discharging circuit selectively discharging the signal electric charge transferred by the vertical charge transfer device to a discharging direction different from other charge-discharging circuit; and an output circuit that outputs the signal electric charge transferred by the vertical charge transfer devices to an outside of the electric charge transfer apparatus.

According to further aspect of the present invention, there is provided an A solid-state imaging device, comprising: a semiconductor substrate; a plurality of photoelectric conversion elements formed on said semiconductor substrate; a plurality of vertical charge transfer device formed above said semiconductor substrate, which transfer signal electric charge photoelectric converted by said photoelectric conversion elements; a plurality of charge-discharging circuits arranged to each line of the charge transfer electrodes, each of the charge-discharging circuit selectively discharging the signal electric charge converted by the photoelectric conversion element at a predetermined position and transferred by the vertical charge transfer device to a discharging direction different from other charge-discharging circuit; and an output circuit that outputs the signal electric charge transferred by the vertical charge transfer devices to an outside of the electric charge transfer apparatus.

According to the present invention, generation of left-behind electric charge caused by the electric charge-discharging direction of an electric charge-discharging device can be remarkably decreased.

DETAILED DESCRIPTION OF THE PREFERRED EMBODIMENTS

FIGS. 1 are diagrams showing an electric charge-discharging structure in a vertical charge transfer device 2 of a solid-state imaging device 101 according to a first embodiment of the present invention.

Figure 1A:
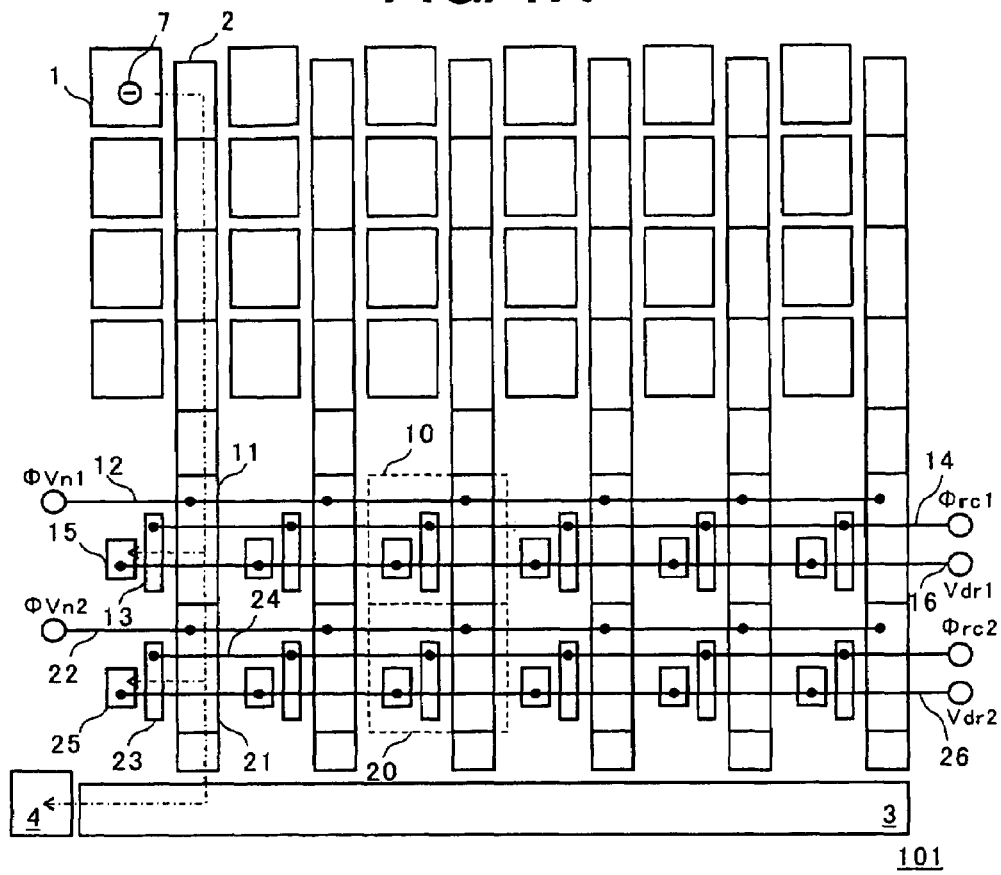
FIG. 1 is a diagram showing an electric charge-discharging structure in a vertical charge transfer device 2 of a solid-state imaging device 101 according to a first embodiment of the present invention.

FIG. 1A is a plan view showing an electric charge flow structure in the vertical charge transfer device 2 of the solid-state imaging device 101.

The solid-state imaging device 101 is consisted of a multiplicity of photoelectric conversion elements 1 arranged in a tetragonal matrix, plurality of columns of the vertical charge transfer devices (VCCD) 2 formed adjacent to each column of the photoelectric conversion elements 1, a horizontal charge transfer device (HCCD) 3 formed at the lower end of the plurality of columns of the vertical charge transfer devices 2 and an output circuit 4 connected to the end of horizontal charge transfer device.

A signal electric charge 7 stored in the photoelectric conversion elements 1 is transferred from upper side of the drawing to the lower side in vertical by the adjacent vertical charge transfer device 2. The horizontal charge transfer device 3 receives the transferred signal electric charge 7 in parallel by the plural columns of the vertical charge transfer devices 2 to transfer to the output circuit 4 in sequence. The output circuit 4 outputs the signal electric charge 7 to the outside of the solid-state imaging device 101 by the horizontal charge transfer device 3.

A first charge-discharging device 10 and a second charge-discharging device 20 are formed serially on the same side at the end of the vertical charge transfer device 2 near the horizontal charge transfer device 3. The first charge-discharging device 10 is consisted of a transfer circuit 11, a discharging control gate 13 and an overflow drain 15 and can selectively discharge the signal electric charge 7 photo-electric converted at a predetermined position and transferred in the vertical charge transfer device 2 to the outside of the solid-state imaging device 101. The second charge-discharging device 20 is consisted of a transfer circuit 21, a discharging control gate 23 and an overflow drain 25 and can discharge the signal electric charge 8 left by the charge-discharging device 10 to the outside the solid-state imaging device 101.

Figure 1B:
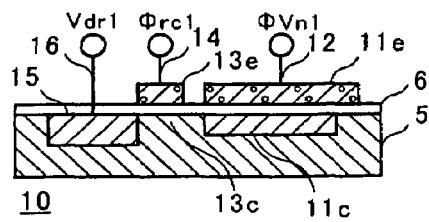

FIG. 1B is a schematic cross sectional view showing a structure of the first charge-discharging device 10.

The transfer circuit 11 is consisted of an n-type transfer channel (hereinafter called just the transfer channel) 11c formed on a surface of a p-well (or a p-type substrate) 5 and a transfer electrode 11e formed upper side of the transfer channel 11c with an insulating film 6 formed therebetween, and forms one transfer unit of the vertical charge transfer device 2. A transfer voltage supplying line 12 supplies a first transfer control voltage $\phi vn1$ to the transfer electrode 11e.

The discharging control gate 13 is consisted of a discharging channel 13c which is an area between the n-type area formed as a discharging circuit 15 and a transfer channel 11c of the transfer circuit 11, and a discharging control gate electrode 13e formed above discharging channel 13c with the insulated film 6 therebetween. Turning on/off of the discharging control gate 13 is controlled by first discharging control voltage $\phi rc1$ supplied by the discharging control voltage supplying line 14. Moreover, when the first discharging control voltage $\phi rc1$ is in a state of high level, it is turned on, and when the discharging control voltage $\phi rc1$ is in a state of low level, it is turned off.

The overflow drain 15 is consisted of an n-type area formed on the surface of the p-well (or a p-type substrate) and is a drain for discharging signal electric charge 7 to the outside. The drain voltage supplying line 16 supplies the first drain voltage Vdr1 to the overflow drain 15.

Figure 1D:
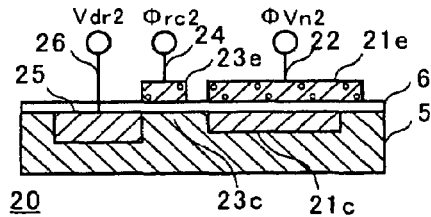
Figure 1C:
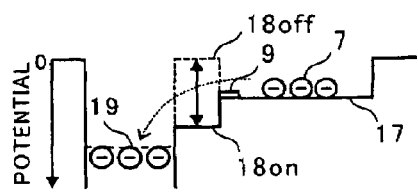

FIG. 1C is an electric potential distribution map formed in a semiconductor of the first charge-discharging device 10 shown in FIG. 1B.

Each of electric potential 17, electric potential 18off, electric potential 18on and electric potential 19 indicates channel electric potential of the transfer channel, channel electric potential at a time of drain operation off (when the control voltage 13c is at the low level) of the discharging channel 13c, channel electric potential at a time of drain operation on (when control voltage $\phi rc1$ is at the high level) of the discharging channel 13c and drain electric potential of the charge-discharging device 15.

During a normal operation of the solid-state imaging elements 101, the charge-discharging control electrode 13e maintains the state of turned-off (control voltage $\phi rc1$ is at the low level), and the signal charge 7 transferred at the vertical charge transfer device 2 is not discharged to the outside, but is transferred to the horizontal charge transfer device 3. Then, depending on necessity, when the signal charge 7 is transferred to the transfer channel 11c, as shown with a dotted arrow in the drawing, by turning on the charge-discharging control electrode 13e (making the control voltage $\phi rc1$ at the high level), the signal charge 7 can be drained from the transfer channel 11c to the charge overflow drain 15 via the discharging channel 13c.

According to the above-described operation, the signal charge photoelectric converted by the photoelectric conversion element 1 at a specific timing can be alternatively thinned out by changing on-off of electric charge drain control electrode 13e at the specific timing.

Moreover, for example, when an electric potential barrier 9 exists in the transfer channel 11c of the first charge-discharging device 10, all of the signal electric charge 7 cannot be drained, and left-behind electric charge 8 (FIG. 1E) may be left in the transfer channel 11c.

FIG. 1D is a schematic cross sectional view showing structure of the second charge-discharging device 20.

The transfer circuit 21 is consisted of a n-type transfer channel (hereinafter called just the transfer channel) 21c formed on the surface of the p-well (or the p-type substrate) 5 and a transfer electrode 21e formed upper side of the transfer channel 21c with the insulating film 6 therebetween, and forms one transfer unit of the vertical charge transfer device 2. A transfer voltage supplying line 22 supplies a second transfer control voltage $\phi vn2$ to the transfer electrode 21e.

The discharging control gate 23 is consisted of a discharging channel 23c which is an area between the n-type area formed as discharging circuit 25 and the transfer channel 21c of the transfer circuit 21, and a discharging control gate electrode 23e formed above the discharging channel 23c with the insulated film 6 therebetween. Turning on/off of the discharging control gate 23 is controlled by second discharging control voltage $\phi rc2$ supplied by the discharging control voltage supplying line 24. Moreover, when the second discharging control voltage $\phi rc2$ is in a state of the high level, the discharging control gate 23 is turned on, and when the discharging control voltage $\phi rc2$ is in a state of the low level, it is turned off.

The overflow drain 25 is consisted of an n-type area formed on the surface of the p-well (or a p-type substrate) and is a drain for discharging the left-behind electric charge 8 to the outside. The drain voltage supplying line 26 supplies the second drain voltage Vdr2 to the overflow drain 15.

Figure 1E:
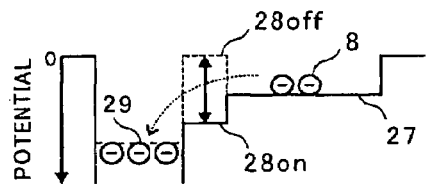

FIG. 1E is an electric potential distribution map formed in the semiconductor of the second charge-discharging device 20 shown in FIG. 1D.

Each of electric potential 27, electric potential 28off, electric potential 28on and electric potential 29 indicates channel electric potential of the transfer channel, channel electric potential at a time of drain operation off (when the control voltage $\phi rc2$ is at the low level) of the discharging channel 23c, channel electric potential at a time of drain operation on (when control voltage $\phi rc2$ is at the high level) of the discharging channel 23c and drain electric potential of the charge-discharging device 25.

During a normal operation of the solid-state imaging elements 101, the charge-discharging control electrode 23e maintains the state of being turned-off (control voltage $\phi rc2$ is at the low level), and the signal charge 7 that is transferred in the vertical charge transfer device 2 is not discharged to the outside, but is transferred to the horizontal charge transfer device 3. Then, after the electric charge-discharging operation (after transferring the left-behind electric charge 8 to the transfer channel 21c) by the first charge-discharging device 10, as shown with an dotted arrow in the drawing, by turning on the charge-discharging control electrode 23e (making the control voltage $\phi rc2$ being high level), the signal charge 8 can be drained from the transfer channel 21c to the charge overflow drain 25 via the discharging channel 13c.

As described in the above, in the first embodiment of the present invention, by providing the second charge-discharging device 20 under the first charge-discharging device 10, the left-behind electric charge 8 left by the first charge-discharging device 10 can be drained by the second charge-discharging device 20. Therefore, the left-behind electric charge 8 can be cleared almost completely.

Since it is considered that the probability that the electric potential barrier 9 exists in the first charge-discharging device 10, and the probability that the electric potential barrier 9 exists in the second charge-discharging device 20 are equivalent, the left-behind electric charge probability of the electric charge-discharging by the first embodiment of the present invention is not "0." Although, when the left-behind electric charge probability of each of the charge-discharging devices 10 and 20 is "1/100", the probability that an electric charge will be left in both the first charge-discharging device 10 and the second charge-discharging device 20 becomes "1/10,000", and can obtain the large improvement effect.

Moreover, although in the embodiment of the present invention, only the first charge-discharging device 10 and the second charge-discharging device 20 are provided, a third charge-discharging device can be further provided. In this case, when the left-behind electric charge probability of each charge-discharging device is "1/100", the probability that an electric charge will be left in all the charge-discharging devices becomes "1/1,000,000", and charge-discharging device probability of electric charge-discharging will be near "0" substantially.

Moreover, the structure shown in FIG. 1A is the same as well-known square lattice arranged CCD solid-state imaging device except the first charge-discharging device 10 and the second charge-discharging device 20.

FIGS. 2 are diagrams showing an electric charge-discharging structure in the vertical charge transfer device 2 of a solid-state imaging device 102 according to a second embodiment of the present invention.

Figure 2A:
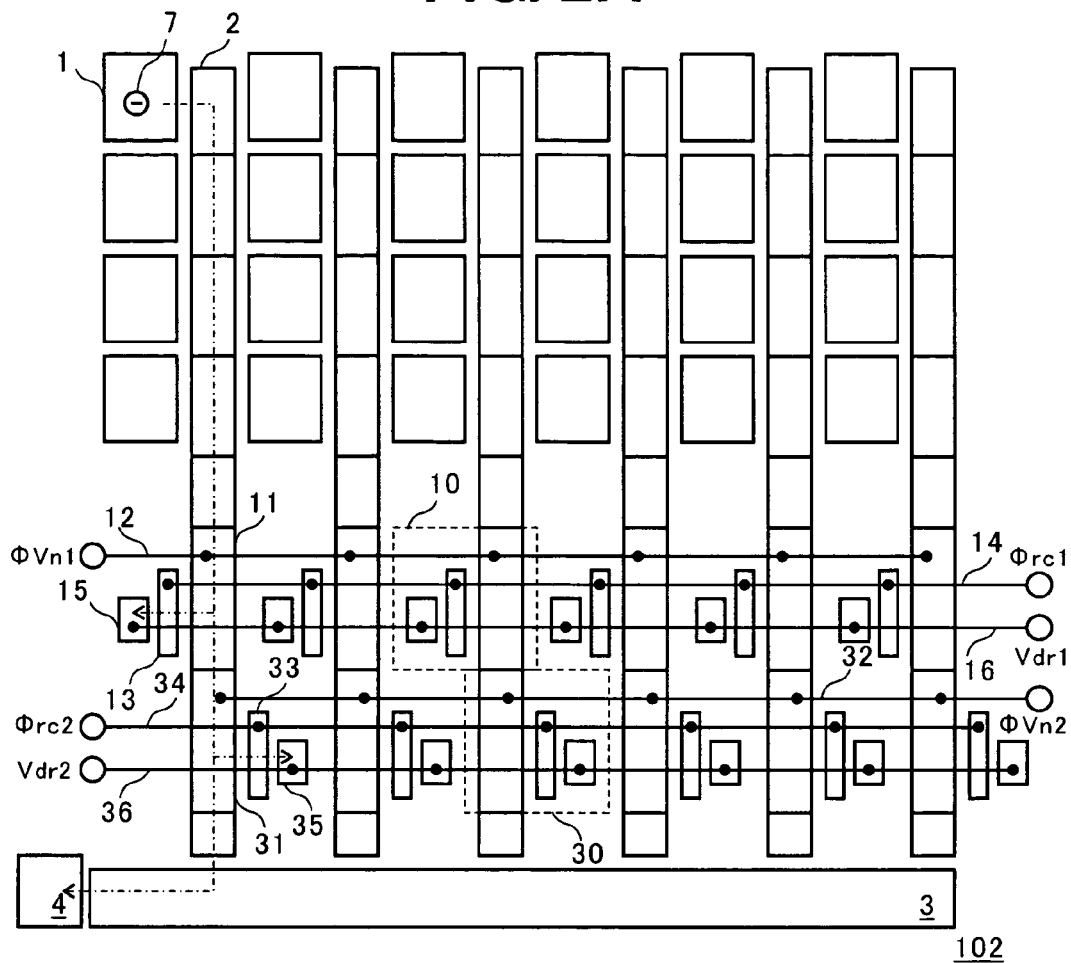
FIG. 2 is a diagram showing an electric charge-discharging structure in the vertical charge transfer device 2 of a solid-state imaging device 102 according to a second embodiment of the present invention.

FIG. 2A is a plan view showing structure of charge-discharging device in the vertical charge transfer device 2 of a solid-state imaging device 102. The solid-state imaging device 102 is different from the above-described first embodiment in a point that the electric charge-discharging directions of the first charge-discharging device 10 and the charge-discharging device 30. Since other structure and operation is the same as the first embodiment, the explanations of them will be omitted.

Figure 2B:
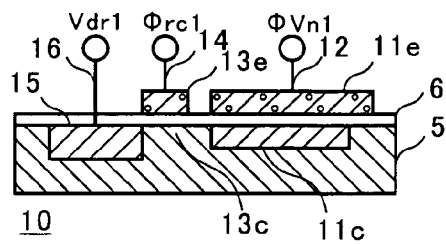
Figure 2D:
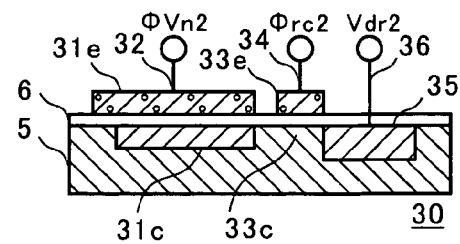

FIG. 2B is a schematic cross sectional view showing structure of the first charge-discharging device 10, and FIG. 2D is a schematic cross sectional view showing structure of a second charge-discharging device 30. Since structure of the first charge-discharging device 10 is the same as the structure of the charge-discharging device 10 shown in FIG. 1B, the explanation for it is omitted. Also, the detailed explanation of the second charge-discharging device 30 will be omitted because only difference between the second charge-discharging device 20 shown in FIG. 1D and the second charging discharging device 30 is that local relationship among each parts are mirror symmetries.

As shown in FIG. 2B and FIG. 2D, the first charge-discharging device 10 has the discharging control gate 13 positioned on the left side of the transfer device 11, and the signal electric charge 7 is discharged to the left-side drain 15. On the other hand, the second charge-discharging device 30 has the discharging control gate 33 positioned on the right side of the transfer device 31, and left-behind electric charge 8 is discharged to the right-side drain 35.

Figure 2C:
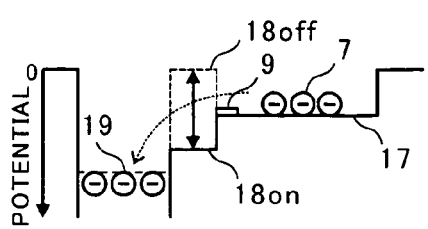
Figure 2E:
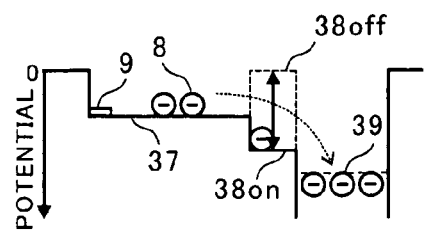

As described in the above, an advantage of making discharging directions of the first charge-discharging device 10 and the second charge-discharging device 30 symmetry is explained by referring electric potential distribution maps shown in FIG. 2C and FIG. 2E.

When the electric potential barrier 9 is extended to a vertical direction in vertical charge transfer device 2 (transfer channels 11c and 31c), as shown in the drawing, it exists discharging channel 13c side in the transfer channel 11c, and it exists opposite side of the discharging channel 33c in the transfer channel 31c. In this case, when charge-discharging direction of the first charge-discharging device 10 and the second charge-discharging device 20 is same, the left-behind electric charge cannot be avoided. However, as in this second embodiment, the left-behind electric charge 8 can be discharged to the overflow drain 35 where is the opposite side of the first charge-discharging device 10 by making the charge-discharging directions of the first charge-discharging device 10 and the second charge-discharging device 30 reversed.

Therefore, according to the second embodiment of the present invention, when the potential barrier which has a spacial correlation exists, the left-behind electric charge by the charge-discharging device can be cut down sharply.

FIGS. 3 are diagrams showing an electric charge-discharging structure in a vertical charge transfer device 2h of a solid-state imaging device 103 according to a third embodiment of the present invention.

Figure 3A:
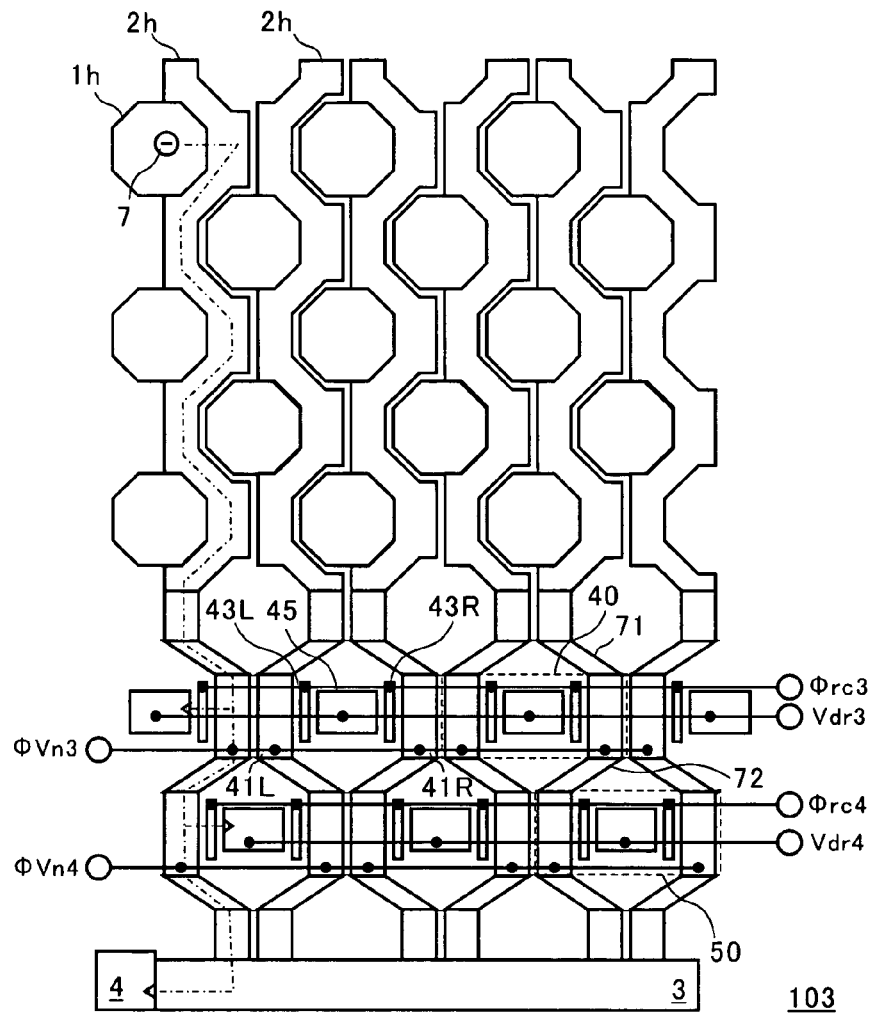
FIG. 3 is a diagram showing an electric charge-discharging structure in a vertical charge transfer device 2h of a solid-state imaging device 103 according to a third embodiment of the present invention.

FIG. 3A is a plan view showing a charge-discharging structure in the vertical charge transfer device 2 of a solid-state imaging device 3.

Photoelectric conversion elements 1h of the solid-state imaging device 103 are disposed in a matrix with a so-called pixel interleaved arrangement (PIA) or the honeycomb arrangement. That is, the photoelectric conversion elements 1h in the even number rows (lines) and in the odd number rows (lines) are shifted in the horizontal direction by about a half pitch of the photoelectric conversion elements 1h, and the photoelectric conversion elements 1h in the even number columns and in the odd number columns are shifted in the vertical direction by about a half pitch of photoelectric conversion elements 1h. The phrase "about a half pitch of photoelectric conversion elements in the column (row) direction" is intended to include also the pitch regarded as substantially equal to the half pitch from the performance and image quality although this pitch is different from the correct half pitch because of manufacture tolerances, rounding errors of pixel positions to be caused by design or mask manufacture, or the like.

The photoelectric conversion elements 1h are diamond shaped fundamentally (strictly speaking, "an octagon") and have a shape wherein the vertices are chamfered. By adapting diamond-shaped pixels with honeycomb arrangement, invalid region can be deceased, and wide transfer circuit of the vertical charge transfer device (VCCD) 2h can be formed. Plural columns of the vertical charge transfer devices (VCCD) 2h arranged along the photoelectric conversion elements 1h of each column are formed by slaloming along the shape of photoelectric conversion elements 1h.

The signal electric charges 7 stored in the photoelectric conversion elements 1h are transferred from upper side to downward vertically by the adjacent vertical charge transfer device 2h. The horizontal charge transfer device 3 receives the signal electric charges 7 transferred by the plural columns of the vertical charge transfer devices 2 in parallel and transfers to output circuit 4 in sequence. The output circuit 4 outputs the signal electric charges 7 transferred by the horizontal charge transfer device 3 to the outside of the solid-state imaging device 103.

By providing a transfer line 71 that is inclined to the verticality, as shown in the drawing, near the end of the vertical charge transfer device 2h close to the horizontal charge transfer device 3, two columns of the adjacent vertical charge transfer devices 2h are made to be closer and the first charge-discharging device 40 is formed in an enlarged space. The first charge-discharging device 40 is consisted of the transfer circuits 41L and 41R of the vertical charge transfer device 2h on either side, discharging controlling gates 43L and 43R on either side and one overflow drain 45, and can discharge the signal electric discharge 7 transferred at the vertical charge transfer devices 2h on either side that is adjacent horizontally to the outside the solid-state imaging device 103. That is, adjacent two columns of the vertical charge transfer devices 2h share one overflow drain 45.

Moreover, as shown in the drawing, a transfer line 72 that is inclined to the opposite direction of the transfer line 71 vertically is provided in the latter line of the first charge-discharging device 40, and a second charge-discharging device 50 with different electric discharging direction from the first charge-discharging device 40 in a space that is enlarged by the inclined transfer line 72.

Figure 3B:
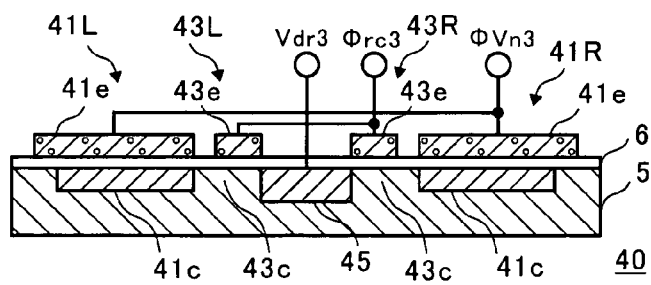

FIG. 3B is a schematic cross sectional view showing structure of the first charge-discharging device 40. Moreover, the explanation for the second charge-discharging device 50 will be omitted because the only difference between the second charge-discharging device 50 and the first charge-discharging device 40 is that the second charge-discharging device 50 corresponds to the vertical charge transfer device 2h shifted one column to a horizontal direction and other structure and operation are almost the same.

Discharging control gate 43L and 43R, each of which is consisted of discharging control electrode 43e and discharging channel 43c are formed on both sides of the overflow drain. Moreover, transfer circuits 41L and 41R each of which is consisted of transfer electrode 41e and transfer channel 41c are formed to the outside of the discharging control gate 43L and 43R. The signal electric charges 7 of the transfer circuit 41L and 41R are discharged by the discharging control gates 43L and 43R which are turned on at the same time from the same overflow drain 45.

Figure 3C:
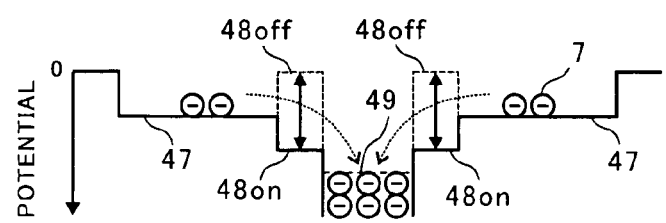

FIG. 3C is an electric potential distribution map formed in the semiconductor of the first charge-discharging device 40 shown in FIG. 3B.

Electrical potential 47 indicates channel electrical potential of the transfer channel 41c. Electrical potential 48off indicates channel electrical potential at a time of discharging operation is turned off (when control voltage φrc3 is at the low level) of the discharging channel 43c. Electrical potential 48on indicates channel electrical potential at a time of discharging operation (when the control voltage φrc3 is at the high level) of the discharging channel 43c. Electrical potential 49 indicates drain electrical potential of the charge-discharging device 45.

When the signal electric charges are transferred to the transfer channels on right and left sides, the signal electric charges 7 can be discharged from the transfer channels on both sides to the charge-discharging device 45 via the discharging channels 43c on right and left sides as shown with dotted arrows in the drawing by making right and left side of the electric charge control electrodes 43e turned on (making the control voltage φrc3 at the high level).

In the second electrical charge-discharging device 50, the same operation is executed, and the left-behind electric charge of the first electric charge-discharging device can be discharged to an opposite direction of the first electric charge-discharging device 40.

As described in the above, in the third embodiment of the present invention, since two columns of the vertical charge transfer devices 2h share one overflow drain 45, the number of drains will be half, and intensity of the horizontal direction can be increased remarkably. Also, left-behind electric charge by the charge-discharging device can be decreased remarkably when the electric potential barrier having special correlation exists as same as the above-described second embodiment by providing the second charge-discharging device 50 that discharges to the different direction at lower line of the first charge-discharging device 40.

Moreover, in the third embodiment, although the number of the drains will be decreased more than the before-described first and second embodiments, actually the number of the drains for the vertical charge transfer device on both sides will be about a half.

Figure 4:
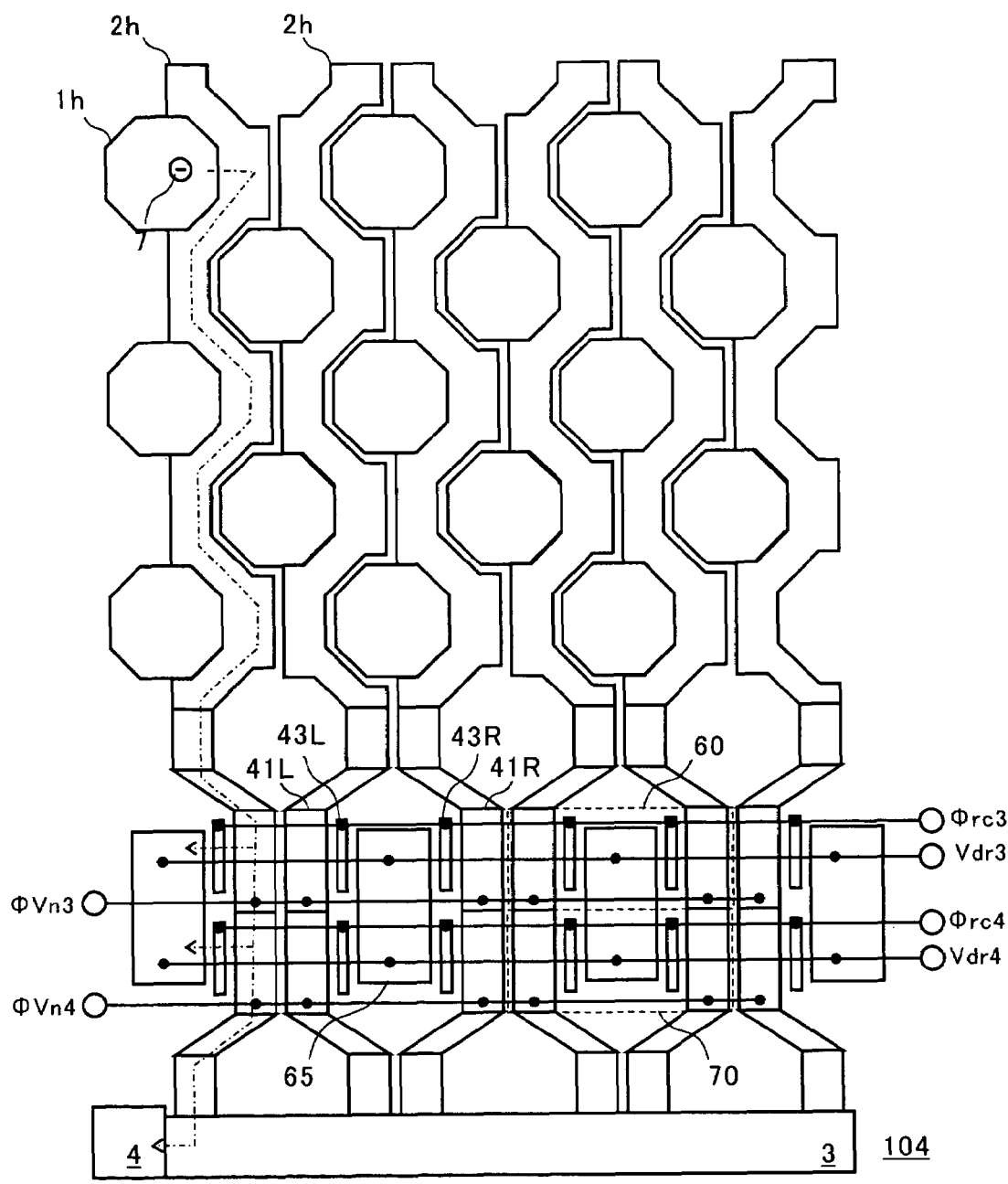
FIG. 4 is a diagram showing an electric charge-discharging structure in the vertical charge transfer device 2h of a solid-state imaging device 104 according to a fourth embodiment of the present invention.

FIG. 4 is a diagram showing an electric charge discharging structure in the vertical charge transfer device 2h of a solid-state imaging device 104 according to a fourth embodiment of the present invention. Detailed explanations for the structure and functions similar to the before-described third embodiment will be omitted, and only a different point will be explained below.

The difference from the before-described third embodiment is that the first charge-discharging device 60 and the second charge-discharging device 70 are formed in a same space. In this case, as shown in the drawing, the overflow drains of the first charge-discharging device 60 and the second charge-discharging device 70 is combined together, and it can be one overflow drain 65. Therefore, according to the fourth embodiment of the present invention, not only intensity of the horizontal direction, but intensity of the vertical direction can be increased remarkably.

As described in the above, according to the first to the fourth embodiments of the present invention, the left-behind electric charges that will be a problem when signal electric charges transferred at the vertical charge transfer device are selectively discharged can be decreased remarkably by providing plurality of the charge-discharging devices for one vertical charge transfer device.

For example, when a probability of generating the left-behind electric charge at one charge-discharging device is η, a probability of the left-behind electric charge at a time of providing n number of charge-discharging devices decreases to the n-th power of η. Here, n<1 and n≧2 (n indicates an integer).

Moreover, in the above-described first to fourth embodiments, the examples providing two charge-discharging devices have been explained. Moreover, providing more than two charge-discharging devices can further decrease the probability of existence of the left-behind electric charge.

Also, in the above-described first and second embodiments, although the CCD solid-state imaging device in a tetragonal matrix is explained as the examples, and in the third and fourth embodiment, the CCD solid-state imaging device in a pixel interleaved arrangement is explained as the examples, the CCD solid-state imaging device in a pixel interleaved arrangement can be adopted for the first and the second embodiments, and the CCD solid-state imaging device in a tetragonal matrix can be adopted for the third and the fourth embodiments.

FIGS. 5 are diagrams showing an electric charge discharging structure in the vertical charge transfer device 82 of the solid-state imaging device 201 according to a first embodiment of the present invention.

Figure 5A:
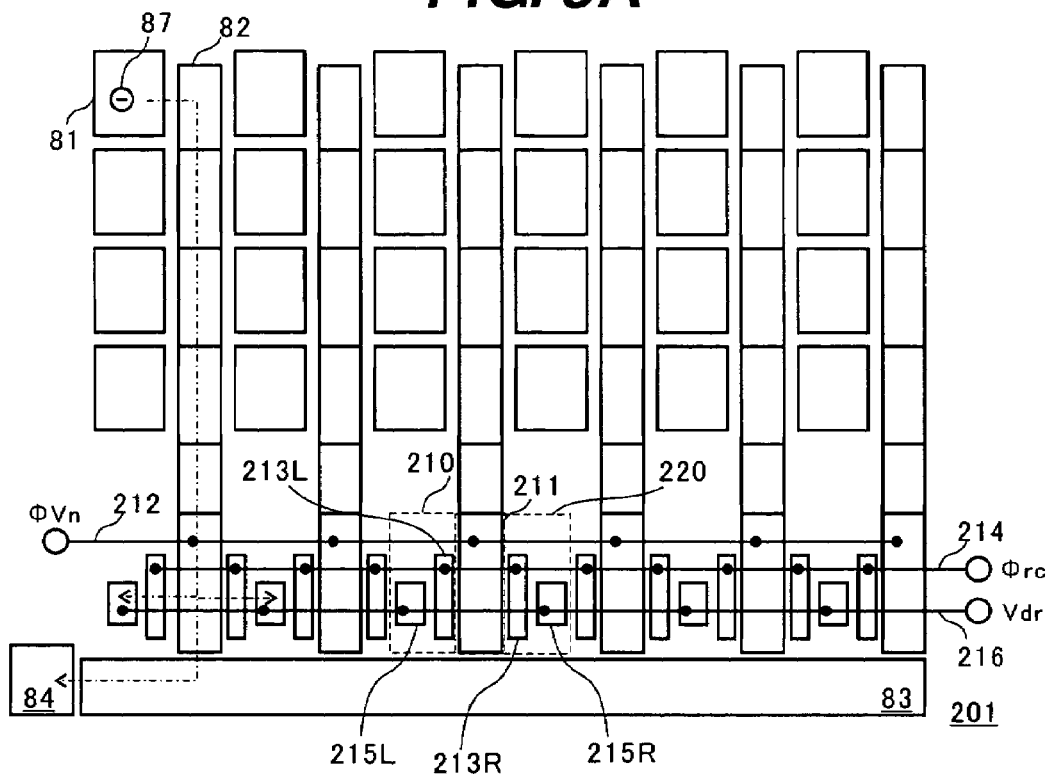
FIG. 5 is a diagram showing an electric charge-discharging structure in the vertical charge transfer device 2 of the solid-state imaging device 101 according to a first embodiment of the present invention.

FIG. 5A is a plan view showing the electric charge-discharging structure in a vertical charge transfer device 82 of a solid-state imaging device 201.

The solid-state imaging device 201 is consisted of a multiplicity of photoelectric conversion elements 81 arranged in a tetragonal matrix, plurality of columns of vertical charge transfer devices (VCCD) 82 formed adjacent to each column of the photoelectric conversion elements 81, a horizontal charge transfer device (HCCD) 83 formed at the end of the plurality of columns of vertical charge transfer devices 82 and an output circuit 84 connected to the end of the horizontal charge transfer device.

Signal electric charges 87 stored in the photoelectric conversion elements 81 are transferred from upper side of the diagram to the lower side in vertical by the adjacent vertical charge transfer device 83. The horizontal charge transfer device 83 receives the transferred signal electric charges 87 in parallel by the plural columns of the vertical charge transfer devices 82 to transfer to an output circuit 84 in sequence. The output circuit 84 outputs the signal electric charges 87 to the outside of the solid-state imaging device 201 by the horizontal charge transfer device 83.

A first electric charge-discharging device 210 and a second electric charge-discharging device 220 are formed serially at the end of the vertical charge transfer device 82 near the horizontal charge transfer device 83.

The first electric charge-discharging device 210 is consisted of a transfer circuit 211, an discharging control gate 213 and an overflow drain 215 and can selectively discharge the signal electric charge 87 photo-electric converted at a predetermined position and transferred in the vertical charge transfer device 82 to the outside the solid-state imaging device 201.

The second charge-discharging device 220 is consisted of a transfer circuit 211, a discharging control gate 213R and an overflow drain 215R and can discharge the signal electric charge 87 photo-electric converted at the same position of the signal electric charge 87 discharged at the charge-discharging device 210 to the outside the solid-state imaging device 201.

Figure 5B:
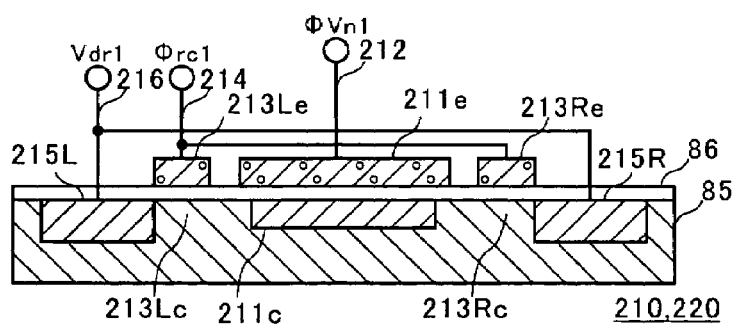

FIG. 5B is a schematic cross sectional view showing a structure of the first charge-discharging device 210 and the second charge-discharging device 220.

The transfer circuit 211 is consisted of an n-type transfer channel (hereinafter called just the transfer channel) 211c formed on a surface of a p-well (or a p-type substrate) 85 and a transfer electrode 211e formed upper side of the transfer channel 211c with an insulating film 86 therebetween, and forms one electric charge transfer unit of the vertical charge transfer device 82. A transfer voltage supplying line 212 supplies a first transfer control voltage $\phi vn1$ to the transfer electrode 211e. Moreover, the transfer circuit 211 is a part of the electric charge-discharging device 210 and the second charge-discharging device 220.

The discharging control gate 213L is consisted of a discharging channel 213Lc which is an area between the n-type area formed as overflow drain 215L and a transfer channel 211c of the transfer circuit 211, and a discharging control gate electrode 213Le formed above the discharging channel 213Lc with the insulated film 86 therebetween.

A discharging control gate 213R is consisted of a discharge channel 213Rc which is an area between the n-type region formed as the overflow drain 215R and the transfer channel 211c of the transfer circuit 211, and a discharging control gate electrode 213Re formed above discharging channel 213Rc with the insulated film 86 therebetween.

Turning on/off of the discharging control gates 213L and 213R are controlled by discharging control voltage $\phi rc$ supplied by the discharging control voltage supplying line 214. Moreover, when the first discharging control voltage $\phi rc1$ is at the high level, the discharging control gates 213L and 213R are turned on, and when the discharging control voltage $\phi rc1$ is at the low level, the discharging control gates 213L and 213R are turned off.

The overflow drains 215L and 215R, each of which is consisted of an n-type area formed on the surface of the p-well (or a p-type substrate) and is a drain for discharging signal electric charges 87 to the outside. The drain voltage supplying line 216 supplies the drain voltage Vdr to the overflow drains 215L and 215R.

Figure 5C:
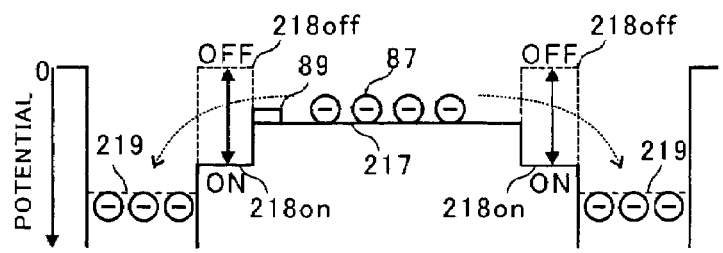

FIG. 5C is an electric potential distribution map formed in a semiconductor of the first charge-discharging device 210 shown in FIG. 5B.

Each of electric potential 217, electric potential 218off, electric potential 218on and electric potential 219 indicates channel electric potential of the transfer channel, channel electric potential at a time of drain operation off (when the control voltage $\phi rc$ is low level) of the discharging channels 213Lc and 213Rc, channel electric potential at a time of drain operation on (when control voltage $\phi rc$ is high level) of the discharging channels 213Lc and 213Rc and drain electric potential of the charge-discharging device 215L and 215R.

During a normal operation of the solid-state imaging elements 201, the charge-discharging control electrodes 213Le and 213Re maintain the state of turned-off (control voltage $\phi rc$ is at the low level), and the signal charges 87 transferred at the vertical charge transfer device 82 are not discharged to the outside, but are transferred to the horizontal charge transfer device 83. Then, depending on necessity, when the signal charges 87 are transferred to the transfer channel 211c, as shown with dotted arrows in the drawing, by turning on the charge-discharging control electrodes 213Le and 213Re (making the control voltage $\phi rc$ at the high level), the signal charges 87 can be discharged from the transfer channel 211c to the charge overflow drains 215L and 215R on right and left sides via the discharging channels 213Lc and 213 Rc.

According to the above-described operation, the signal charges photoelectric converted at the photoelectric conversion element 81 at a specific timing can be alternatively thinned out by changing on-off of electric charge drain control electrodes 213Le and 213Re at the specific timing.

For example, as shown in the drawing, an electrical potential barrier 89 exists in the first charge-discharging device side 210 in a common transfer channels, the signal electric charge below fixed quantity cannot be discharged to the overflow drain 215L. However, in the process which results in the overflow drain 215R of the second electric charge-discharging circuit 220, the electrical potential barrier 89 does not exist, and the signal electric charge below fixed quantity can be discharged through overflow drain 215R.

Moreover, for example, even when the potential barrier 9 exists in the center mostly in the common transfer channels 211c, the signal electric charge below the fixed quantity from the first electric charge-discharging device 210 side is discharged through overflow drain 215L, and the signal electric charge below the fixed quantity from the second electric charge-discharging circuit 220 side is discharged through overflow drain 215R.

As described in the above, according to the fifth embodiment of the present invention, even if the electrical potential barrier 89 exists in the common transfer channel 211c, the signal electric charge below the fixed quantity can be discharged through either one of the first charge-discharging device 210 side and the second charge-discharging device 220 side on which the electrical potential barrier 89 does not exist. Therefore, left-behind electric charge can be removed.

Moreover, the structure shown in FIG. 5A is similar to the well-known CCD solid-state imaging device in a tetragonal matrix except the first charge-discharging device 210 and the second charge-discharging device 220.

Figure 6:
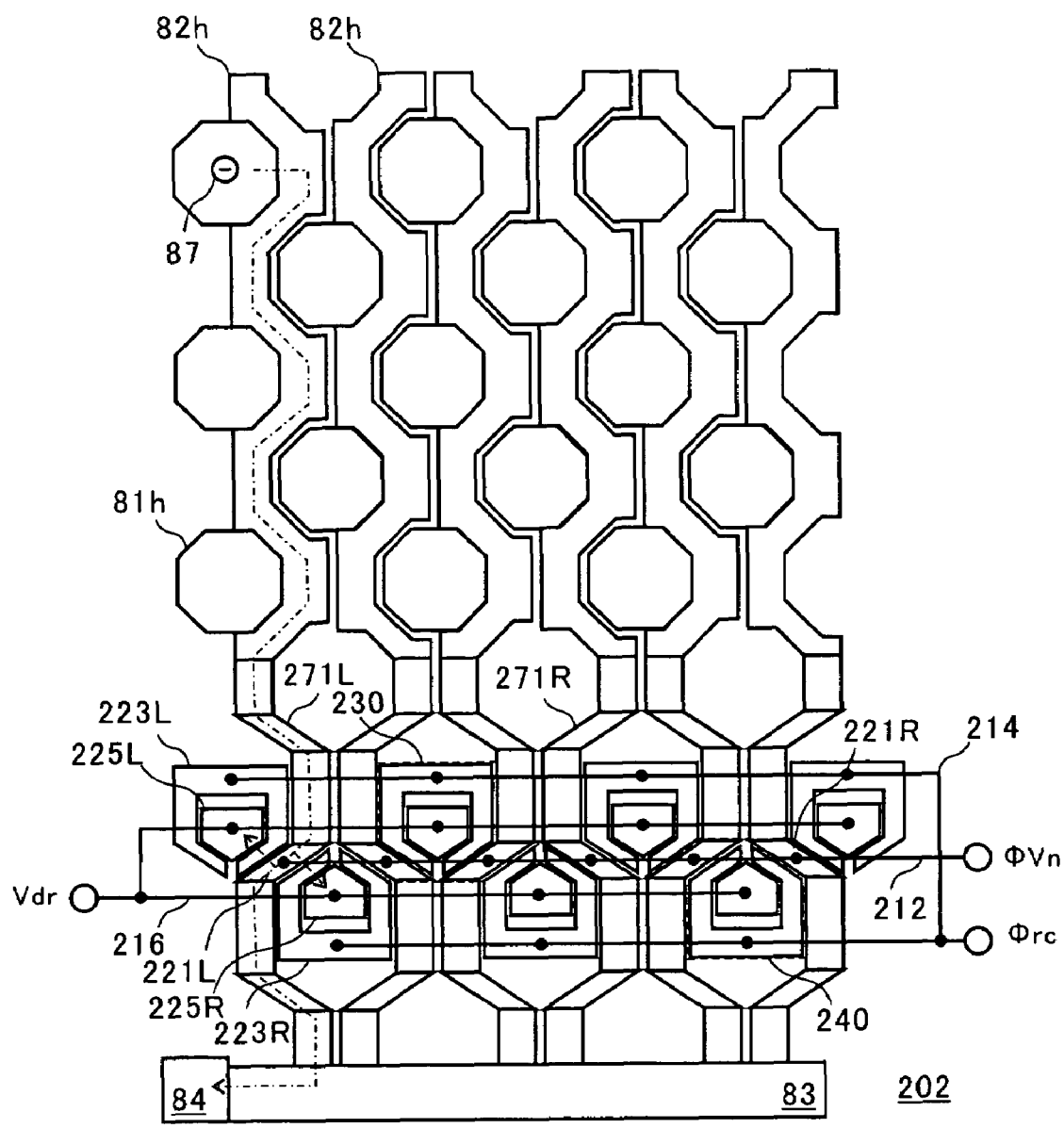
FIG. 6 is a diagram showing an electric charge-discharging structure in the vertical charge transfer device 2 of the solid-state imaging device 102 according to a second embodiment of the present invention.
Figure 7A:
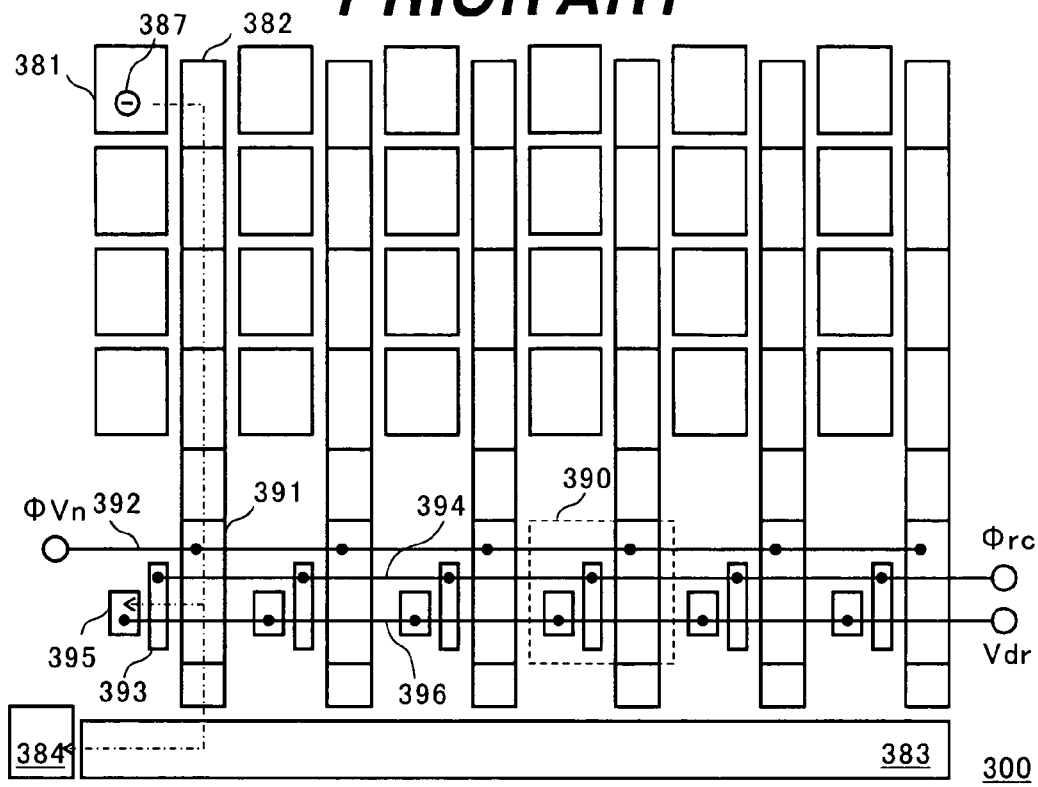
FIG. 7 is a diagram showing an electric charge-discharging structure in the vertical charge transfer device of the conventional solid-state imaging device 300.
Figure 7B:
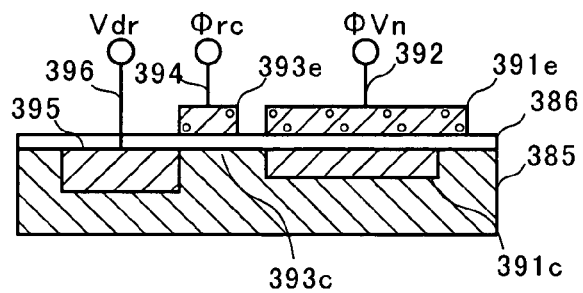
Figure 7C:
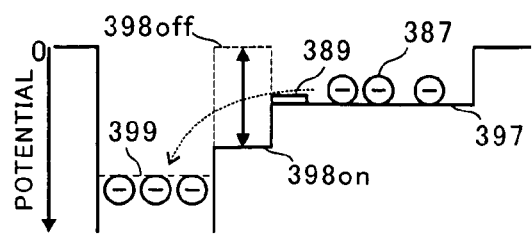

FIG. 6 is a diagram showing an electric charge-discharging structure in the vertical charge transfer device 82h of the solid-state imaging device 202 according to a sixth embodiment of the present invention.

Photoelectric conversion elements 81h of the solid-state imaging device 202 are disposed in a matrix with a so-called pixel interleaved arrangement or the honeycomb arrangement. That is, the photoelectric conversion elements 81h in the even number rows (lines) and in the odd number rows (lines) are shifted in the horizontal direction by about a half pitch of photoelectric conversion elements 81h, and the photoelectric conversion elements 81h in the even number columns and in the odd number columns are shifted in the vertical direction by about a half pitch of photoelectric conversion elements 81h.

The photoelectric conversion elements 81h are diamond shape fundamentally and have a shape wherein the vertices are chamfered. By adapting diamond-shaped pixels with honeycomb arrangement, invalid region can be deceased, and wide transfer circuit of the vertical charge transfer device (VCCD) 82h can be formed. Plural columns of the vertical charge transfer devices (VCCD) 82h arranged along the photoelectric conversion elements 1h of each column are formed by slaloming along the shape of photoelectric conversion elements 81h.

The signal electric charges 87 stored in the photoelectric conversion elements 81h are transferred from upper side to downward vertically by the adjacent vertical charge transfer device 82h. The horizontal charge transfer device 83 receives the signal electric charges 87 transferred by the plural columns of the vertical charge transfer device 82 in parallel and transfers to output circuit 84 in sequence. The output circuit 84 outputs the signal electric charges 87 transferred by the horizontal charge transfer device 83 to the outside the solid-state imaging device 202.

By providing a transfer lines 271L and 271R that is inclined to the verticality as shown in the diagram around the horizontal charge transfer device 83 at the end of the vertical charge transfer device 82h, the vertical charge transfer devices 82h horizontally adjoining each other are made closer, and the first charge-discharging device 230 is formed in an enlarged space. The first charge-discharging device 230 is consisted of the inclined transfer circuits 221L and 221R of the vertical charge transfer device 82h on either side, discharging controlling gate 223L and one overflow drain 225L, and can discharge the signal electric discharge 87 transferred at the vertical charge transfer devices 82h on either side that is adjacent horizontally to the outside the solid-state imaging device 202. That is, adjacent two columns of the vertical charge transfer devices 82h share one overflow drain 225.

Moreover, as shown in the drawing, a inclined transfer circuit 221L and 221R of the first charge-discharging device is inclined to the opposite direction of the transfer lines 271L and 271R vertically, and a second charge-discharging device 240 with different electric discharging direction from the first charge-discharging device 230 in a space that is enlarged by the inclined transfer lines 221L and 221R.

The second charge-discharging device 240 is consisted of the inclined transfer circuits 221L and 221R of the vertical charge transfer device 82h on both sides, discharging control gate 223R and one overflow drain 225R, and can discharge the signal electric charge 87 transferred at the vertical charge transfer devices on both sides which are adjacent horizontally to the outside the solid-state imaging device 202. That is, it has structure that adjacent two columns of vertical charge transfer devices 82h share one overflow drain.

Discharging principles and the like of the above-described charge-discharging device is almost same as the before-described fifth embodiment, and detailed explanation will be omitted.

As described in the above, according to the sixth embodiment of the present invention, since two columns of the vertical charge transfer devices 82h share one overflow drain 225 (225L or 225R), the number of the drains decreases half, and intensity of the horizontal direction will be increased.

Also, the left-behind electric charge with charge-discharging direction of the charge-discharging device can be removed as same as the above-described fifth embodiment by providing the second charge-discharging device 240 that has different charge-discharging direction on the charge transfer line (transfer channel) 211 that is same as the first charge-discharging device 230.

Moreover, although the number of the drains will be decreased than the before-described fifth embodiment, actually it may be possible that the vertical charge transfer devices on both sides cannot share the overflow drain, and the number of the drains for the vertical charge transfer device on both sides will not be a perfect ½, but will be about a half.

As described in the above, according to the embodiments of the present invention, the left-behind electric charge that will be a problem at a time of discharging signal electric charge to be transferred at the vertical charge transfer device can be decreased remarkably by providing plurality of the charge-discharging devices with different charge-discharging direction for one vertical charge transfer device.

For example, when probability of generating left-behind electric charge at one charge-discharging device is $\eta$, probability of left-behind electric charge at a time of providing n number of charge-discharging devices decreases to the n-th power of $\eta$. Here, $n<1$ and $n\geq2$ (n indicates an integer).

Moreover, in the above-described first to fourth embodiments, the examples with two charge-discharging devices have been explained. Moreover, probability of existence of the left-behind electric charge can be decreased by providing more than two charge-discharging devices.

Also, in the above-described fifth embodiment, the CCD solid-state imaging device in a tetragonal matrix has been used as an example, and in the sixth embodiment, the CCD solid-state imaging device in a pixel interleaved arrangement has been used as an example. CCD solid-state imaging device in a pixel interleaved arrangement can be adopted for the fifth embodiment, and the CCD solid-state imaging device in a tetragonal matrix can be adopted for the sixth embodiment.

The present invention has been described in connection with the preferred embodiments. The invention is not limited only to the above embodiments. It is apparent that various modifications, improvements, combinations, and the like can be made by those skilled in the art.

What are claimed are:

1. An electric charge transfer apparatus, comprising:
   a plurality of columns of photoelectric conversion elements, each column of photoelectric conversion elements containing a plurality of photoelectric conversion elements, a plurality of columns of vertical charge transfer devices, each column of the plurality of columns of vertical charge transfer devices being formed adjacent to each column of the plurality of photoelectric conversion elements and transferring a signal electric charge converted by each photoelectric conversion element of the adjacent column of photoelectric conversion elements;

a plurality of charge-discharging circuit sets each set being connected to an end of each column of the vertical charge transfer devices near an horizontal charge transfer device, each charge-discharging circuit set including at least two charge-discharging circuits connected in a serial manner for discharging the signal electric charge transferred by at least one of the vertical charge transfer devices of the respective column of vertical charge transfer devices connected thereto, each of the at least two charge-discharging circuits forming a vertical transfer unit, wherein a first charge-discharging circuit of the at least two charge-discharging circuits discharges the signal electric charge transferred by at least one of the vertical charge transfer devices of the respective column of vertical charge transfer devices connected thereto at a predetermined position, and a second charge-discharging circuit of the at least two charge-discharging circuits discharges the signal electric charge left by the first charge-discharging circuit to an outside of the electric charge transfer apparatus;

the horizontal charge transfer device being formed at a lower end of the columns of the vertical charge transfer devices and connected at one end thereof with an output circuit, wherein the output circuit outputs the signal electric charge transferred by the vertical charge transfer devices to the outside of the electric charge transfer apparatus.

2. An electric charge transfer apparatus according to claim 1, wherein the horizontal charge transfer device receives the signal electric charge in parallel from the plurality of columns of vertical charge transfer circuits and transfers the received signal electric charge in sequence to the output circuit.

3. An electric charge transfer apparatus according to claim 1, wherein the first charge-discharging circuit of the at least two charge-discharging circuits selectively discharges the signal electric charge transferred by the plurality of vertical charge transfer devices.

4. An electric charge transfer apparatus according to claim 3, wherein the second charge-discharging circuits of the at least two charge-discharging circuits discharges the signal electric charge left after the discharging of the first charge-discharging circuit.

5. A solid-state imaging device, comprising:

a semiconductor substrate;

a plurality of columns of photoelectric conversion elements formed on said semiconductor substrate;

a plurality of columns of vertical charge transfer devices formed above said semiconductor substrate, each column of the plurality of columns of vertical charge transfer devices being formed adjacent to each of the photoelectric conversion elements and transfers a signal electric charge converted by the adjacent column of photoelectric conversion element;

a plurality of charge-discharging circuit sets each set being connected to an end of each column of the vertical charge transfer devices near a horizontal charge transfer circuit, each charge-discharging circuit set including at least two charge-discharging circuits connected in a serial manner for discharging the signal electric charge converted by the photoelectric conversion element at a predetermined position and transferred by at least one of the vertical charge transfer devices of the respective column of vertical charge transfer devices connected thereto, each of the at least two charge-discharging circuits forming a one vertical transfer unit, wherein a first charge-discharging circuit of the at least two charge-discharging circuits discharges the signal electric charge transferred by at least one of the vertical charge transfer devices of the respective column of vertical charge transfer devices connected thereto at a predetermined position, and a second charge-discharging circuit of the at least two charge-discharging circuits discharges the signal electric charge left by the first charge-discharging circuit to outside of the electric charge transfer apparatus;

the horizontal charge transfer device being formed at a lower end of the vertical charge transfer devices and connected at one end thereof to an output circuit, wherein the output circuit outputs the signal electric charge transferred by the vertical charge transfer devices to outside.

* * * * *